United States Patent [19]

Phy

[11] Patent Number: 4,796,080
[45] Date of Patent: Jan. 3, 1989

[54] SEMICONDUCTOR CHIP PACKAGE CONFIGURATION AND METHOD FOR FACILITATING ITS TESTING AND MOUNTING ON A SUBSTRATE

[75] Inventor: William S. Phy, Los Altos Hills, Calif.

[73] Assignee: Fairchild Camera and Instrument Corporation, Mountain View, Calif.

[21] Appl. No.: 122,545

[22] Filed: Nov. 3, 1987

Related U.S. Application Data

[63] Continuation of Ser. No. 758,607, Jul. 23, 1987, abandoned.

[51] Int. Cl.[4] .................. H01L 23/48; H02G 13/08
[52] U.S. Cl. ........................... 357/70; 357/74; 357/69; 357/80; 174/52 FP; 174/52 R; 361/421; 324/158 F; 339/17 C; 339/17 CF; 339/17 LC
[58] Field of Search .............. 357/70, 74, 68, 69, 357/80; 174/52.1, 52.4; 361/421; 324/158 F, 158 D; 439/68, 78, 69

[56] References Cited

U.S. PATENT DOCUMENTS

| | | | |
|---|---|---|---|
| 3,444,440 | 5/1969 | Bell et al. | 357/70 |
| 3,444,441 | 5/1969 | Helda et al. | 357/70 |
| 3,611,061 | 10/1971 | Segerson | 357/70 |
| 4,204,317 | 5/1980 | Winn | 357/70 |
| 4,463,217 | 7/1984 | Orcutt | 357/70 |
| 4,466,183 | 8/1984 | Burns | 29/827 |

FOREIGN PATENT DOCUMENTS

| | | |
|---|---|---|
| 3410196 | 9/1985 | Fed. Rep. of Germany . |
| 2568059 | 1/1986 | France . |
| 0053968 | 3/1982 | Japan . |
| 0161349 | 9/1983 | Japan . |
| 0210650 | 12/1983 | Japan .................. 357/74 |

OTHER PUBLICATIONS

Jerry Lyman, "Surface Mounting Alters the PC-Board Scene", *Electronics*, Feb. 9, 1984, pp. 113–116.

Primary Examiner—William L. Sikes
Assistant Examiner—Georgia Y. Epps
Attorney, Agent, or Firm—Fitch, Even, Tabin & Flannery

[57] ABSTRACT

A semiconductor chip package configuration and a method are disclosed for facilitating testing of the chip package and mounting of the chip package on a substrate by forming one or more lead alignment bars in interconnecting relation with adjacent leads on the chip package, the lead alignment bars being formed from a material providing electrical isolation between leads during testing of the chip package and for providing physical spacing between the leads both during testing and later mounting of the chip package on the substrate so as to prevent adjacent leads from inadvertent contact. Preferably, the lead alignment bars are formed from a high resistivity material selected to provide sufficient conductivity between the interconnected leads for minimizing electrostatic discharge conditions therebetween, the material being sufficiently non-conductive to permit functional and dynamic testing of the leads. After testing of the chip package, it is mounted on the substrate with the interconnecting lead alignment bars then being removed to facilitate subsequent operation of the chip package.

6 Claims, 2 Drawing Sheets

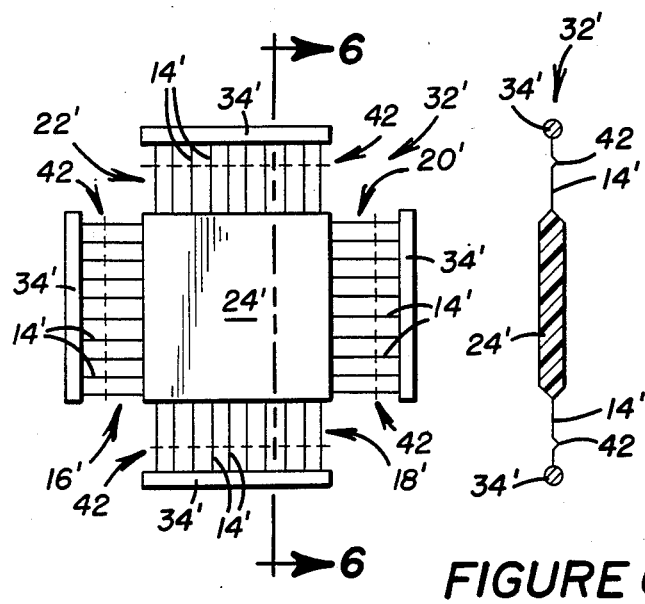
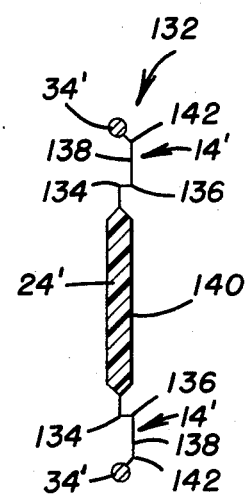
FIGURE 5  FIGURE 6  FIGURE 7
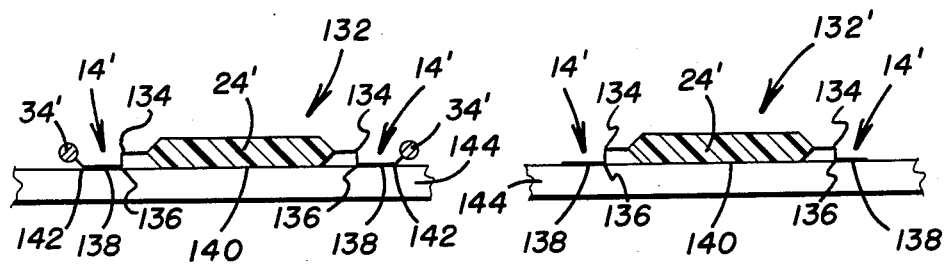
FIGURE 8  FIGURE 9

SEMICONDUCTOR CHIP PACKAGE CONFIGURATION AND METHOD FOR FACILITATING ITS TESTING AND MOUNTING ON A SUBSTRATE

This application is a continuation of application of Ser. No. 758,607, filed July 23, 1985, abandoned.

BACKGROUND OF THE INVENTION

The present invention relates to a semiconductor chip package configuration and method of formation and more particularly to such a chip package configuration and method of formation for facilitating attaching and testing of the chip package and subsequent surface mounting thereof on a substrate such as a printed circuit board or the like. By chip package, it is meant the combination of a semiconductor chip and surrounding enclosure with protruding leads.

Numerous techniques have been disclosed in the prior art for forming semiconductor chip packages and mounting them on substrates such as printed circuit boards to facilitate subsequent operation. Conventionally, the individual semiconductor chip packages have been electrically tested in test devices having sockets or tests heads arranged for electrical communication with the respective leads on the chip pakcage. Such testing makes it necessary, of course, to maintain the leads in electrical isolation from each other. Thereafter, the chip packages are mounted either manually or automatically upon a suitable substrate such as a printed circuit board with the individual leads being interconnected with respective conductors on the substrate. The leads and conductors are then joined together using techniques which are well known in the prior art, such as vapor phase soldering, thermode reflow soldering, etc.

As can be seen, alignment of the leads on the chip package is of critical importance both during testing and mounting. As noted above, the leads must be maintained in electrical isolation from each other during testing. Spacing is equally critical during mounting of the chip package on a substrate in order to assure proper alignment and attachment of the respective leads to conductors on the substrate.

In a conventional technique for forming the basic components of a semiconductor chip package such as referred to above, the leads are formed in a lead frame comprising dam bars and/or tie bars which maintain proper spacing between the leads, facilitate application of the packaging to the chip package, etc. The tie bars connect adjacent leads at their outermost perimeter, while dam bars connect adjacent leads at the innermost point of the leads next to the semiconductor chip package package. However, with the tie bars and dam bars being formed from conductive material along with other portions of the lead frame, they must be removed or disconnected from between the leads before testing of the chip package can begin in order to establish electrical isolation for the leads. Particularly in more recently developed techniques of surface mounting, as contemplated by the present invention, each of the leads project from the semiconductor package in cantilevered fashion so that they are susceptible to dislocation which may result in undesirable contact between adjacent leads or improper registration and, hencemounting of the leads on the substrate.

This problem has been found to be even more severe recently, because of the reduced pitch or spacing of the leads necessitated by the existence of much higher density integrated circuit chip packages having high pin or lead count. For example, in typical semiconductor chip packages of the type employed at the present time, the pitch or spacing of the leads has commonly been reduced from about 0.050 to 0.025 inches in order to permit greater lead density in the chip packages.

With the contemplation of ever greater lead densities for such semiconductor chip packages, there is an increasing need for means to maintain proper alignment and spacing of the leads during both testing and mounting of the chip packages on suitable substrates.

SUMMARY OF THE INVENTION

It is therefore an object of the invention to provide an integrated circuit semiconductor chip package configuration and method of formation for overcoming one or more problems of the type referred to above.

More particularly, it is an object of the invention to provide a semiconductor chip package configuration and method of formation for chip packages including a number of closely spaced leads wherein removable lead alignment bar means are formed in interconnecting relation with adjacent leads on the chip package, the lead alignment bar means being formed from material suitable for providing electrical isolation between the leads during testing and, thereafter, for providing physical spacing between the leads during mounting of the chip package on a substrate. The interconnecting lead alignment bar means may be removed from the chip package after testing and/or installation to facilitate subsequent operation of the chip package.

It is a further related object of the invention to provide such a semiconductor chip package configuration and method of formation wherein the lead alignment bar means is formed from a material whose conductivity provides the degree of electrical isolation between the leads required for enabling functional and dynamic testing of the leads and the degree of electrical conductivity required to minimize electrostatic discharge conditions between the leads. Preferably, all of the leads on a chip package are electrically in contact with the lead alignment bar means.

It is a further object of the invention to provide such a chip package configuration and method of formation wherein removal of the lead alignment bar means is facilitated by scoring, or similarly localized stressing or weaking, of the leads intermediate the lead alignment bar means and packaging means for the chip package.

Another object of the invention is to provide a lead alignment bar means having the above objects and advantages without the need for any basic modifications to standard chip package test sockets.

In accordance with the preceding description and statement of objects in connection with the present invention, it is to be noted that the invention is particularly applicable to complex or high cost digital semiconductor devices and more particularly to such digital semiconductor devices in the form of microprocessors, microcontrollers and gate arrays having a high count of external leads or pins. Such semiconductor devices have been found to be particularly sensitive to electrostatic discharge conditions.

Additional objects and advantages of the invention are apparent from the following description having reference to the accompanying drawings.

BRIEF DESCRIPTION OF THE DRAWINGS

FIG. 1 is also generally representative of the prior art with respect to the present invention.

FIG. 5 is a view of the semiconductor chip package of FIG. 2 with the tie bars and dam bars removed so that the chip package is adapted for testing and mounting with the alignment bar means of the present invention.

FIG. 6 is a side view in elevation of the chip package configuration of FIG. 5.

FIG. 7 is a view generally similar to FIG. 6 with the leads being offset relative to a center line of the chip package package for facilitating surface mounting of the chip package on a substrate.

FIG. 8 is a side view in elevation of the semiconductor chip package of FIG. 7 mounted upon a suitable substrate such as a printed circuit board.

FIG. 9 is a view similar to FIG. 8 with the alignment bars of the present invention removed from the leads of the semiconductor chip package after it is mounted upon and electrically attached to the substrate.

DESCRIPTION OF THE PREFERRED EMBODIMENTS

Figure 1:
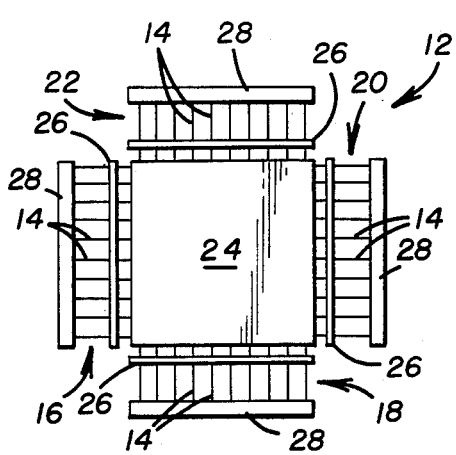
FIG. 1 is a plan view of a generally conventional semiconductor chip package of the type contemplated by the present invention, the semiconductor chip package of FIG. 1 being shown in a stage of its construction or assembly where it includes conductive elements which must be removed prior to testing of the chip package. Thus.

Referring initially to FIG. 1, a digital semiconductor device configured according to the prior art is generally indicated at 12.

The chip package 12 is of a multi-sided construction having leads 14 arranged in parallel in arrays 16, 18, 20 and 22, each array positioned on a different side of the chip package 12.

The leads 14 are initially formed as part of a lead frame which includes all of the leads 14 and a conventional interconnecting structure (not shown in the figure) underlying the central packaging material 24. The packaging material 24 may for example be either plastic or ceramic depending upon the particular application for the chip package.

The lead frame of the chip package 12 commonly includes integrally formed dam bars 26 and tie bars 28. As illustrated in FIG. 1, the dam bars 26 form electrically conductive interconnections between the lead 14 closely adjacent to the packaging material 24. At the same time, the tie bars 28 similarly form electrically conductive interconnections between the various arrays of lead 14 at their outboard ends.

The bars 26 and 28 serve different functions at an intermediate stage of manufacture and/or mounting of the chip package 12. The dam bars 26 are employed particularly in connection with chip packages having plastic packaging material 24 which ususally is applied to the lead frame by conventional transfer molding. This transfer molding technique involves application of the packaging material 24 to the lead frame with the packaging material being in a semisolid form forced into a mold (not shown) arranged upon the lead frame. During this molding step, the dam bars 26 assist in containing the molded packaging material in place. During this molding process, the tie bars 28 also serve to maintain the proper alignment and spacing of the leads 14.

Upon completion of the molding step as described above, common practice involves interconnection of the individual leads of the chip package 12 with a test head or socket (not shown), the test head also being of conventional construction in accordance with the prior art. As noted above, it is necessary during testing that the leads be electrically isolated from each other in order to permit proper testing of the chip package.

Accordingly, it was also contemplated in the prior art that both the dam bars 276 and tie bars 28 be removd from the chip package prior to testing. This is commonly accomplished by first machining or otherwise removing those portions of the dam bars 26 serving to interconnect the leads 14. During this step, the tie bars 28 maintain proper alignment and spacing of the leads. Thereafter, the tie bars 28 are removed, preferably by cutting or shearing them off from the outboard ends of the leads 14.

It can be seen that the leads 14 become individually cantileverd beams with no means other than their own individual bending or shear strength for maintaining their precise spatial alignment and separation relative to each other. Accordingly, it was found to be rleatively difficult in the prior art to achieve proper alignment of the leads with the test head and also to maintain proper alignment and spacing of the leads during mounting of the chip package 12 upon a suitable substrate.

The present invention is particularly contemplated for overcoming or eliminating these problems as is described in detail below with reference to FIGS. 2–9. A wide variety of chip package configurations is encompassed by the present invention. However, the present invention particularly contemplates an integrated circuit chip package adapted for surface mounting with the leads 16 extending from the chip package in generally cantilevered fashion as may be better seen for example with reference to FIGS. 3, 6 and 7. The present invention is applicable to either digital or analog integrated circuits.

Figure 2:
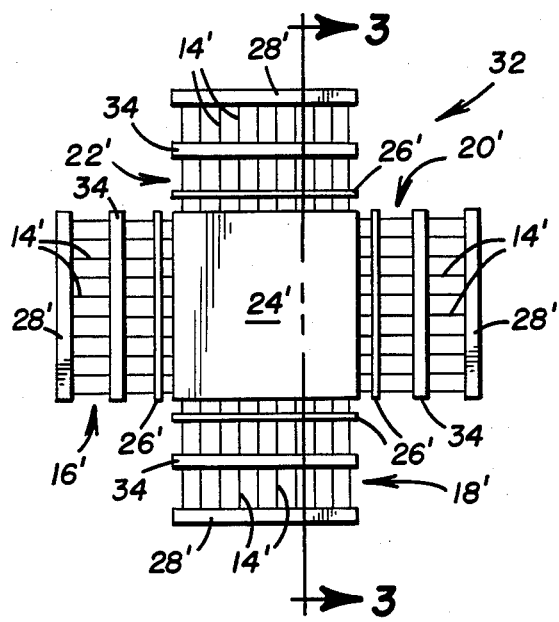
FIG. 2 is a view of one embodiment of the present invention wherein alignment bars formed from material selected in accordance with the present invention are arranged in interconnection with the adjacent leads prior to removal of the lead frame conductive tie bars.

Referring first to FIG. 2, a semiconductor chip package constructed in accordance with the present invention is indicated at 32. The chip package 32 is illustrated in FIG. 2 in an intermediate state in its manufacture prior to testing and mounting of the chip package upon a substrate, as described hereinbelow. At the same time, the semiconductor chip package 32 includes a number of features corresponding to those described in connection with the prior art chip package of FIG. 1, those corresponding components being indicated by similar primed numerical labels. For example, the chip package 32 includes similar leads 14' arranged in arrays 16', 18', 20' and 22'. As with the prior art representation of FIG. 1, the leads 14' are preferably formed as part of an initial lead frame including dam bars 26' and tie bars 28' constructed in the same manner as described above with reference to FIG. 1.

According to the present invention, chip package 32 differs from chip package 12 of FIG. 1 in that chip package 32 also includes removable lead alignment bars 34 interconnecting each of the leads 14'. Preferably, the lead alignment bars 34 are interconnected with the leads 14 intermediate the dam bars 26' and tie bars 28'.

As will be described in greater detail below, the lead alignment bars 34 function to maintain alignment, spacing an electrical isolation of the leads both during testing and mounting of the chip package on a suitable substrate and to reduce or minimize electrostatic discharge conditions between the leads 14' during testing and handling. To enable the lead alignment bars 34 to perform this latter function, the bars 34 are preferably formed from semiconductive material selected to provide sufficient conductivity between the leads 14. At the same time, the material of the lead alignment bars 34 is also selected to be sufficiently non-conductive in order to permit conventional functional and dynamic testing of the chip package's circuits which are internally connected on the chip package to the individual leads. The lead alignment bars 34 preferably serve an additional function of maintaining proper alignment and spacing of the leads 14 to assure their proper alignment with conductors formed on a substrate such as will be described in greater detil below with reference to FIGS. 8 and 9.

The material of the lead alignment bars 34 is selected to exhibit relatively high resistivity preferably in the range of $10^6$ to $10^9$ ohm centimeters. This material may, for example, consist of a semiconductive plastic or a ceramic material. In the embodiment of FIG. 2, the lead alignment bars 34 are preferably formed from a high density filled polyurethane material.

With the material of the lead alignment bars 34 being similar to that of the packaging 24', it is thus possible, in cases where the shorting feature is eliminated, for both the packaging 24' and the lead alignment bars 34 to be applied to the chip package 32 during the same molding step commonly employed in the prior art for forming the packaging of the chip package, as described above. In accordance with the present invention, it is only necessary to modify the mold cavities of the prior art in order to permit application of the lead alignment bars 34 at the same time.

Alternatively, the alignment bars 34 could consist of a ceramic material that is attached to the leads 14' in a conventional manner by glass/metal interfaces or by brazing. Another alternative would be to mold a plastic alignment bar 34 on leads 14' of a ceramic packaged chip package 32 after final sealing but prior to trimming of the tie bars 28'.

Figure 3:
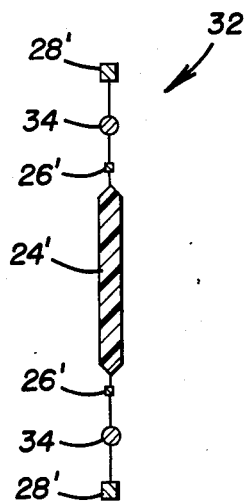
FIG. 3 is a side view in elevation of the chip package configuration of FIG. 2.

The construction of the semiconductor chip package 32 as described above in connection with FIG. 2 is made more apparent by reference to the sectioned view of FIG. 3.

After construction of the semiconductor chip package 32 in accordance with the preceding description, the dam bars 26' and tie bars 28' may be removed in the same manner as described above for chip package 12 shown in FIG. 1. For example, the dam bars 26' could again be removed by machining or cutting away interconnecting material between the leads 14'. The tie bars 28' could preferably be removed by shearing or cutting the leads closely adjacent to the lead alignment bars 34.

It is also to be noted in connection with the present invention that, if spacial alignment and separation of the leads 14' could be maintained during preliminary formation of the lead frame, at least up to the point of installing the lead alignment bars 34, the tie bars 28' could be entirely eliminated from the chip package 32 since they serve only a redundant function in combination with the lead alignment bars 34.

Figure 4:
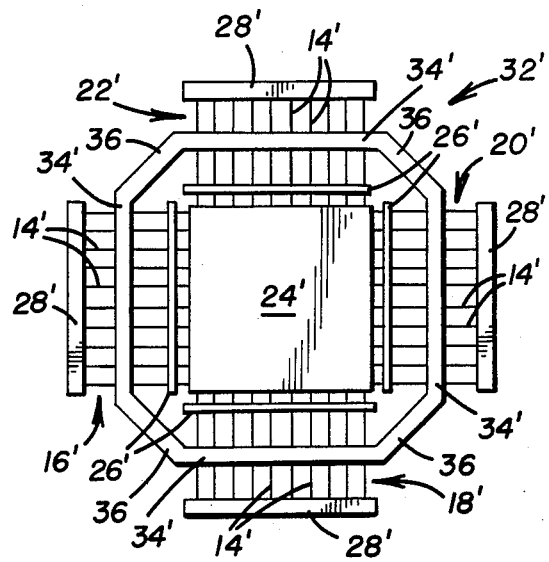
FIG. 4 illustrates another variation of the embodiment of FIG. 2, also in accordance with the present invention to provide equal electrical potential.

Another embodiment of a semiconductor chip package according to the present invention is indicated at 32' in FIG. 4. In the embodiment 32' of FIG. 4, the chip package is of substantially similar construction as that described above in connection with FIGS. 2 and 3, except that the lead alignment bars 34' in FIG. 4 are interconnected with each other as indicated at 36. The interconnections 36 are formed from similar material as the lead alignment bars 34' and may be formed by the same molding operation as the bars 34'.

The chip package 32' is illustrated at a later point of manufacture in FIGS. 5 and 6 wherein the dam bars 26' and tie bars 28' have been removed. Thus, in the embodiment of FIGS. 5 and 6, the lead alignment bars 34' remain to maintain relative alignment, spacing and electrical isolation of the leads 14' during electrical testing of the chip package 32' and thereafter, if desired, during mounting of the chip package 32' on a substrate.

As best seen in FIG. 6, before or after testing chip package 32', in order to facilitate easy removal of the lead alignment bars 34' from chip package 32', the leads 14' are scored, or otherwise similarly subjected to localized stressing or weakening as indicated at 42 inboard of lead alignment bars 34'. This scoring 42 is illustrated in FIG. 5 by broken lines intersecting each array of leads 14'.

Another embodiment of a semiconductor chip package according to the present invention is illustrated at 132 in FIG. 7. Chip 132 is initially formed in substantially the same manner described above in connection with the embodiment 32' of FIGS. 5 and 6. However, where the embodiment of FIGS. 5 and 6 is a "flat" package shaped chip package, the embodiment of FIG. 7 is a "gull-wing" package. The only difference in the embodiment of FIG. 7 as compared to that of FIGS. 5 and 6 concerns the configuration of the leads 14' extending laterally in cantilevered fashion from the packaging material 24'. As may be seen in the embodiment of FIGS. 5 and 6, the leads 14' extend directly outwardly from the packaging material. In the embodiment of FIG. 7, the leads 14' may be formed with two perpenedicular angles 134 and 136 closely adjacent the edges of the packaging 24' so that an outboard portion 138 of the leads is arranged generally parallel with a surface 140 of the packaging 24'. The reason for this configuration will be made more apparent below with reference to FIGS. 8 and 9. In any event, the leads 14' in this embodiment are similarly scored at the outboard ends of the segments 138, as indicated at 142, inboard of, and adjacent to the lead alignment bars 34'.

Referring to FIG. 8, the chip package 132 of FIG. 7 is illustrated with its surface 140 abutting a substrate 144. The substrate 144, as noted above, may be of a conventional type adapted for surface mounting of semiconductor chip packages thereupon. In accordance with the preceding description, the lead alignment bars 34' serve to maintain proper relative alignment and spacing between the leads 14' while they are mounted upon and interconnected with conventional conductive elements (not shown) on the substrate 144.

After the semiconductor chip package 132 is mounted upon the substrate 144 as described above, the lead alignment bars 34' may be removed, preferably by breaking of the leads 14' at the second locations 142.

FIG. 9 is a view similar to FIG. 8 with the lead alignment bars 34' of the present invention removed from the leads of the semiconductor chip package shown at 132′, after it is mounted upon and electrically attached to conductors on substrate 144′.

It should be realized that the present invention is especially suited for high density digital or analog integrated circuit chip packages wherein the minute amounts of current coupled between adjacent leads by the lead alignment bars according to the present invention will not preclude effective testing of the integrated circuit existing on the semiconductor chip package. In most cases, such alignment bars would not be useable on analog integrated circuits or in certain high speed digital circuits where voltage margins are small as compared with currents generated by these partially conductive alignment bars.

Within the preceding description, there have thus been set forth both configurations for a semiconductor chip package and methods for facilitating its testing and mounting upon a suitable substrate. Various modifications and additions are believed obvious within both the chip package configurations and methods of the invention in addition to those referred to above. Accordingly, the scope of the present invention is defined only by the following appended claims.

What is claimed is:

1. An integrated circuit semiconductor chip package having a plurality of closely spaced, freely extending, external leads internally connected to an integrated circuit for enabling electrical conduction to and from the integrated circuit, said chip package being of the type including a lead frame including electrically conductive bar means externally interconnecting said leads, said chip package further including lead alignment bar means removably externally interconnecting said leads for maintaining alignment thereof upon removal of said conductive bar means, said lead alignment bar means being formed from a semiconductive material selected to provide sufficient conductivity between said leads to substantially reduce electrostatic discharge conditions between leads during testing and handling, said semiconductive material being further selected to be sufficiently non-conductive to permit conventional functional and dynamic testing of said integrated circuit.

2. The integrated circuit semiconductor chip package of claim 1 wherein said conductive bar means comprise tie bar means at the outer ends of said leads for maintaining physical spacing between said leads, and further comprise dam bar means interconnecting the inner ends of said leads for facilitating formation of said chip package, said tie bar means and said dam bar means being removable from interconnecting relationship with said leads prior to testing of said chip package.

3. The semiconductor chip package of claim 2 wherein said lead alignment bar means are located between said dam bar means and said tie bar means.

4. The semiconductor chip package of claim 1 wherein said semiconductor material is selected from the class consisting of semiconductive plastic exhibiting high resistivity and semiconductive ceramic exhibiting high resistivity.

5. The semiconductor chip package of claim 1 wherein said semiconductive material exhibits resistivity generally in the range of $10^6$ to $10^9$ ohm centimeters.

6. The semiconductor chip package of claim 1 wherein said external leads are divided into a plurality of sets, each set extending from a respective side of said integrated circuit, said alignment bar means being arranged to electrically interconnect each said set of leads.

* * * * *

UNITED STATES PATENT AND TRADEMARK OFFICE
CERTIFICATE OF CORRECTION

PATENT NO. : 4,796,080
DATED : January 3, 1989
INVENTOR(S) : William S. Phy

It is certified that error appears in the above-identified patent and that said Letters Patent is hereby corrected as shown below:

Column 2, line 49, "weaking" should read --weakening--.

Column 4, line 19, "276" should read --26--.

Column 4, line 29, "cantileverd" should read --cantilevered--.

Column 4, line 32, "rleatively" should read --relatively--.

Column 5, line 23, "detil" should read --detail--.

Column 6, line 29, "embodim ent" should read --embodiment--.

Column 6, line 66, "second" should read --scored--.

Signed and Sealed this

Fifteenth Day of August, 1989

Attest:

DONALD J. QUIGG

*Attesting Officer*　　*Commissioner of Patents and Trademarks*